(12) United States Patent
Xie et al.

(10) Patent No.: US 12,417,876 B2
(45) Date of Patent: Sep. 16, 2025

(54) CIRCUIT MODULE AND SOLID-STATE TRANSFORMER SYSTEM

(71) Applicant: Delta Electronics (Shanghai) Co., Ltd., Shanghai (CN)

(72) Inventors: Yicong Xie, Shanghai (CN); Weiqiang Zhang, Shanghai (CN); Ziying Zhou, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 607 days.

(21) Appl. No.: 17/807,384

(22) Filed: Jun. 17, 2022

(65) Prior Publication Data
US 2023/0017496 A1 Jan. 19, 2023

(30) Foreign Application Priority Data
Jul. 19, 2021 (CN) .......................... 202110815506.8

(51) Int. Cl.
*H05K 9/00* (2006.01)
*H01F 27/02* (2006.01)
*H01F 27/28* (2006.01)
*H01F 27/36* (2006.01)

(52) U.S. Cl.
CPC .......... *H01F 27/2885* (2013.01); *H01F 27/02* (2013.01); *H01F 27/36* (2013.01); *H05K 9/0049* (2013.01)

(58) Field of Classification Search
CPC .............................. H01F 27/36; H05K 9/0049
See application file for complete search history.

(56) References Cited

U.S. PATENT DOCUMENTS

| 4,942,380 A | 7/1990 | Bradford et al. |
| 5,374,779 A | 12/1994 | Konishi |

(Continued)

FOREIGN PATENT DOCUMENTS

| CN | 1326201 A | 12/2001 |
| CN | 101606209 A | 12/2009 |

(Continued)

OTHER PUBLICATIONS

The Office Action of the China Application No. 202110815515.7, dated Apr. 3, 2025.

(Continued)

*Primary Examiner* — Hung V Ngo
(74) *Attorney, Agent, or Firm* — CKC & Partners Co., LLC

(57) ABSTRACT

The present disclosure provides a circuit module and a solid-state transformer system. The circuit module includes: a first circuit unit outputting a first voltage; a second circuit unit outputting a second voltage, where the second voltage is less than the first voltage; and a shielding structure arranged between the first circuit unit and the second circuit unit, where the shielding structure includes: a first conductor layer electrically coupled to the first circuit unit, a second conductor layer electrically coupled to the second circuit unit, a third conductor layer located between the first conductor layer and the second conductor layer; a first insulation layer arranged between the first conductor layer and the third conductor layer; and a second insulation layer arranged between the second conductor layer and the third conductor layer.

20 Claims, 10 Drawing Sheets

(56) References Cited

U.S. PATENT DOCUMENTS

| | | | |
|---|---|---|---|
| 2004/0222511 A1 | 11/2004 | Zhang | |
| 2010/0109830 A1* | 5/2010 | Hanser | H01F 27/324 |
| | | | 174/140 R |
| 2016/0057901 A1 | 2/2016 | Sargeant et al. | |
| 2018/0054114 A1* | 2/2018 | Wu | H05K 9/0049 |
| 2018/0153046 A1 | 5/2018 | Xie et al. | |
| 2018/0183400 A1* | 6/2018 | Mizutani | H05K 9/0049 |
| 2019/0304664 A1* | 10/2019 | Oh | H05K 1/181 |
| 2019/0362887 A1* | 11/2019 | Yang | H01F 27/292 |
| 2020/0082975 A1* | 3/2020 | Yang | H01F 17/0013 |
| 2020/0187394 A1* | 6/2020 | Murugesan | H05K 9/0062 |
| 2020/0253581 A1* | 8/2020 | Kubota | A61B 8/44 |
| 2022/0108829 A1* | 4/2022 | Sho | H01F 27/2885 |
| 2022/0110229 A1* | 4/2022 | Koh | H05K 9/0049 |
| 2022/0407433 A1 | 12/2022 | Liu et al. | |

FOREIGN PATENT DOCUMENTS

| | | |
|---|---|---|
| CN | 101626676 A | 1/2010 |
| CN | 102510712 A | 6/2012 |
| CN | 104754929 A | 7/2015 |
| CN | 101873762 B | 8/2015 |
| CN | 105074487 A | 11/2015 |
| CN | 107018646 A | 8/2017 |
| CN | 104900634 B | 3/2018 |
| CN | 108831716 B | 11/2019 |
| CN | 112032550 A | 12/2020 |
| DE | 202013007444 U1 | 10/2013 |
| EP | 0936045 A1 | 8/1999 |
| JP | H08139483 A | 5/1996 |
| JP | H10150288 A | 6/1998 |
| JP | 2008172015 A | 7/2008 |
| WO | 2010134552 A1 | 11/2010 |
| WO | 2020164085 A1 | 8/2020 |

OTHER PUBLICATIONS

The office action of U.S. Appl. No. 17/812,433 mailed on Jun. 2, 2025.

The Office Action of China application No. 2021108155157 mailed on Aug. 14, 2025.

* cited by examiner

CIRCUIT MODULE AND SOLID-STATE TRANSFORMER SYSTEM

CROSS-REFERENCE TO RELATED APPLICATION

This application claims priority to Chinese Patent Application No. 202110815506.8, filed on Jul. 19, 2021, which is hereby incorporated by reference in its entirety.

TECHNICAL FIELD

The present disclosure relates to the field of power electronic technologies and, in particular, to a circuit module and a solid-state transformer system.

BACKGROUND

In recent years, with the development of power distribution networks to smart grids, high-power power electronic conversion devices have been widely used, through a modularization strategy, in the fields such as electric power quality control, energy storage, electrical drive, and new energy sources including solar energy and wind energy, whereby medium-voltage conversion devices are used for energy transmission of relevant power systems. The medium voltage is defined with a wide range, and generally ranges from 2.4 KV to 69 KV. The medium voltage applied in China, the United States and Europe has a typical value of 10 KV, 13.8 KV and 20 KV, respectively.

Compared with conventional air insulation, solid insulation is advantageous in high breakdown field strength, uniform electric field, and manipulable field strength. Use of the solid insulation can save insulation space between circuit modules so that the circuit modules used in the medium voltage field maintain the advantage of high power density, and meanwhile can strengthen insulation reliability and mechanism protection and simplify installation steps. An existing circuit module generally relies on a one-piece solid insulation layer for insulation protection, for example, a shielding structure for insulation prepared by traditional casting molding with epoxy resin. However, as the level of the medium withstand voltage increases, the thickness of the shield structure in the circuit module also increases significantly, resulting in a relatively heavy weight of the shielding structure. The weight of the shielding structure accounts for a relatively high proportion in the circuit module, rendering that it is difficult for the circuit module to achieve light-weight and it is difficult to increase power density.

Therefore, it is urgent to develop a circuit module whose shielding structure not only has a solid insulation property, but is also benefit for achieving high power density and lightweight of the circuit module.

SUMMARY

In view of the above problem, the present disclosure is targeted at providing a solid-state transformer system and a circuit module which have relatively good insulation performance and relatively high power density, and which meet design requirements for lightweight.

In a first aspect, an embodiment of the present disclosure provides a circuit module, including: a first circuit unit outputting a first voltage; a second circuit unit outputting a second voltage, where the second voltage is less than the first voltage; and a shielding structure arranged between the first circuit unit and the second circuit unit; where the shielding structure includes: a first conductor layer electrically coupled to the first circuit unit; a second conductor layer electrically coupled to the second circuit unit; a third conductor layer located between the first conductor layer and the second conductor layer; a first insulation layer arranged between the first conductor layer and the third conductor layer; and a second insulation layer arranged between the second conductor layer and the third conductor layer.

In some optional implementations, the third conductor layer is electrically coupled to a reference voltage between the first voltage and the second voltage.

In some optional implementations, a potential difference between the first conductor layer and the third conductor layer is equal to a potential difference between the third conductor layer and the second conductor layer.

In some optional implementations, the shielding structure further includes: a third insulation layer; and two third conductor layers spaced apart, each of which is located between the first insulation layer and the second insulation layer, where the third insulation layer is located between the two third conductor layers, the two third conductor layers are electrically coupled to a first reference voltage and a second reference voltage, respectively, and the first reference voltage and the second reference voltage are both between the first voltage and the second voltage.

In some optional implementations, an absolute value of a potential difference between two sides of the first insulation layer, an absolute value of a potential difference between two sides of the second insulation layer, and an absolute value of a potential difference between two sides of the third insulation layer are equal.

In some optional implementations, the first conductor layer is configured to cover the first circuit unit, and the second conductor layer is configured to cover the second circuit unit.

In some optional implementations, the circuit module further includes: a shell configured to cover the circuit module, where the first insulation layer is configured to cover the first conductor layer, the second insulation layer is configured to cover the second conductor layer, and the first circuit unit is disposed in parallel with the second circuit unit.

In some optional implementations, the shell is electrically coupled to the third conductor layer.

In some optional implementations, the shell includes a first shell and a second shell, where: the first shell is configured to cover the first circuit unit, the first conductor layer, and the first insulation layer; the second shell is configured to cover the second circuit unit, the second conductor layer, and the second insulation layer; and the first shell and the second shell have therebetween a common interface layer for forming the third conductor layer.

In some optional implementations, the circuit module further includes: a shielding layer, where a first insulating medium is arranged between the shielding layer and the shell, and the shielding layer includes a first shielding layer and a second shielding layer, where the first shielding layer is configured to cover the first circuit unit, the first conductor layer, and the first insulation layer; the second shielding layer is configured to cover the second circuit unit, the second conductor layer, and the second insulation layer; the first shielding layer and the second shielding layer have therebetween a common interface layer for forming the third conductor layer; and the shell is grounded.

In some optional implementations, the circuit module further includes: a third circuit unit, located between the first circuit unit and the second circuit unit, and outputting a third voltage between the first voltage and the second voltage, where the third conductor layer is configured to cover the third circuit unit, a second insulating medium is arranged between the shell and the first conductor layer, between the shell and the second conductor layer, and between the shell and the third conductor layer, and the second insulating medium is integrally formed with the first insulation layer and the second insulation layer.

In a second aspect, an embodiment of the present disclosure provides a solid-state transformer system, including: multiple circuit modules according to the first aspect.

Compared with the prior art, the circuit module and the solid-state transformer system provided in the embodiments of the present disclosure have at least the following advantages.

The circuit module has a shielding structure, and a first circuit unit and a second circuit unit arranged on two sides of the shielding structure, respectively. The shielding structure has a first insulation layer and a second insulation layer which are used for protecting the first circuit unit and the second circuit unit.

One side of the first insulation layer close to the first circuit unit is provided with a first conductor layer electrically coupled to the first circuit unit, so that the first circuit unit is shielded by an equipotential charged body, and the air on the side of the first circuit unit can be prevented from being broken down and discharged. One side of the second insulation layer close to the second circuit unit is provided with a second conductor layer electrically coupled to the second circuit unit, so that the second circuit unit is shielded by an equipotential charged body, and the air on the side of the second circuit unit can be prevented from being broken down and discharged.

A third conductor layer is provided between the first insulation layer and the second insulation layer. With such arrangement, the third conductor layer can separate the original one-piece insulation layer into two independent parts, and the insulation layer is partitioned into two parts, i.e., the first insulation layer and the second insulation layer, for voltage division. According to the theory of dielectric breakdown, the thinner the thickness of the insulating medium, the higher its dielectric strength, that is, after a one-piece insulation layer is partitioned into two parts, the thickness of each part of the insulation layer does not decrease linearly according to a decrease in a voltage difference between two sides of this part of the insulation layer. After the thicknesses of the first insulation layer and the second insulation layer is reduced, the dielectric strength of the first insulation layer and the second insulation layer is higher than that of the one-piece insulation layer. A sum of thickness upon stacking the first insulation layer and the second insulation layer is smaller than the thickness of the one-piece insulation layer without the third conductor layer. Therefore, the shielding structure of the circuit module according to the present disclosure has relatively good insulation performance, and its overall thickness can be reduced, moreover, the weight of the shielding structure accounts for a smaller proportion in the circuit module, so that the circuit module has high power density and meets design requirements for lightweight.

In addition to the technical problem to be solved in the embodiments of the present disclosure, technical features constituting the technical solutions and beneficial effects produced by the technical features of these technical solutions as described above, further descriptions will be made detailedly in Detailed Description with regard to other technical problems to be solved by the circuit module and the solid-state transformer system according to the embodiments of the present disclosure, other technical features contained in the technical solutions and beneficial effects produced by these technical features.

BRIEF DESCRIPTION OF DRAWINGS

In order to illustrate technical solutions in embodiments of the present disclosure or the prior art more clearly, the accompanying drawings used for description of the embodiments of the present disclosure or the prior art will be briefly described hereunder. Obviously, the accompanying drawings in the following description are intended for some embodiments of present disclosure, based on which other drawings may be obtained by persons of ordinary skill in the art without any creative effort.

DETAILED DESCRIPTION

In order to make the aforementioned objectives, features and advantages of the embodiments of the present disclosure more clear and understandable, the technical solutions in the embodiments of the present disclosure will be described hereunder clearly and comprehensively with reference to the accompanying drawings in the embodiments of the present disclosure. Apparently, the described embodiments are merely a part of embodiments of the present disclosure, rather than all embodiments of the present disclosure. All other embodiments obtained by persons of ordinary skill in the art based on embodiments of the present disclosure without any creative effort shall fall into the protection scope of the present disclosure.

In the prior art, a shielding structure in a circuit unit for insulation is generally a one-piece solid insulation layer by casting molding with epoxy resin. The circuit unit may be applied to medium-voltage grids with different voltage levels, such as 10 KV, 13.8 KV and 20 KV. When the circuit unit is applied in a grid with a relatively high voltage level, its shielding structure is relatively thick in thickness, that is, the thickness of the shielding structure when the circuit unit is applied in a 20 KV grid increases significantly compared to the thickness of the shielding structure when the circuit unit is applied in a 10 KV grid, in turn resulting in a heavier weight of the shielding structure, so that the weight of the shielding structure accounts for a relatively large proportion in the circuit module, and the power density of the circuit module is relatively low.

In view of this, the embodiments of the present application provide a circuit unit and a solid-state transformer system, where the circuit unit includes a shielding structure, the shielding structure includes a first insulation layer, a second insulation layer, and a third conductor layer arranged between the first insulation layer and the second insulation layer. Therefore, the shielding structure has two parts, i.e., the first insulation layer and the second insulation layer, for voltage division. Compared with a one-piece insulation layer without arrangement of the third conductor layer, the thickness of the first insulation layer and the second insulation layer is relatively thin, and the dielectric strength is raised. As a result, a sum of thickness of the stacked first insulation layer and second insulation layer is smaller than the thickness of the one-piece insulation layer without arrangement of the third conductor layer, that is, the overall thickness of the shielding structure is reduced, and the weight of the shielding structure accounts for a smaller portion in the circuit module. Therefore, the circuit module with such a shielding structure has a relatively high power density and meets design requirements for lightweight.

Figure 1:
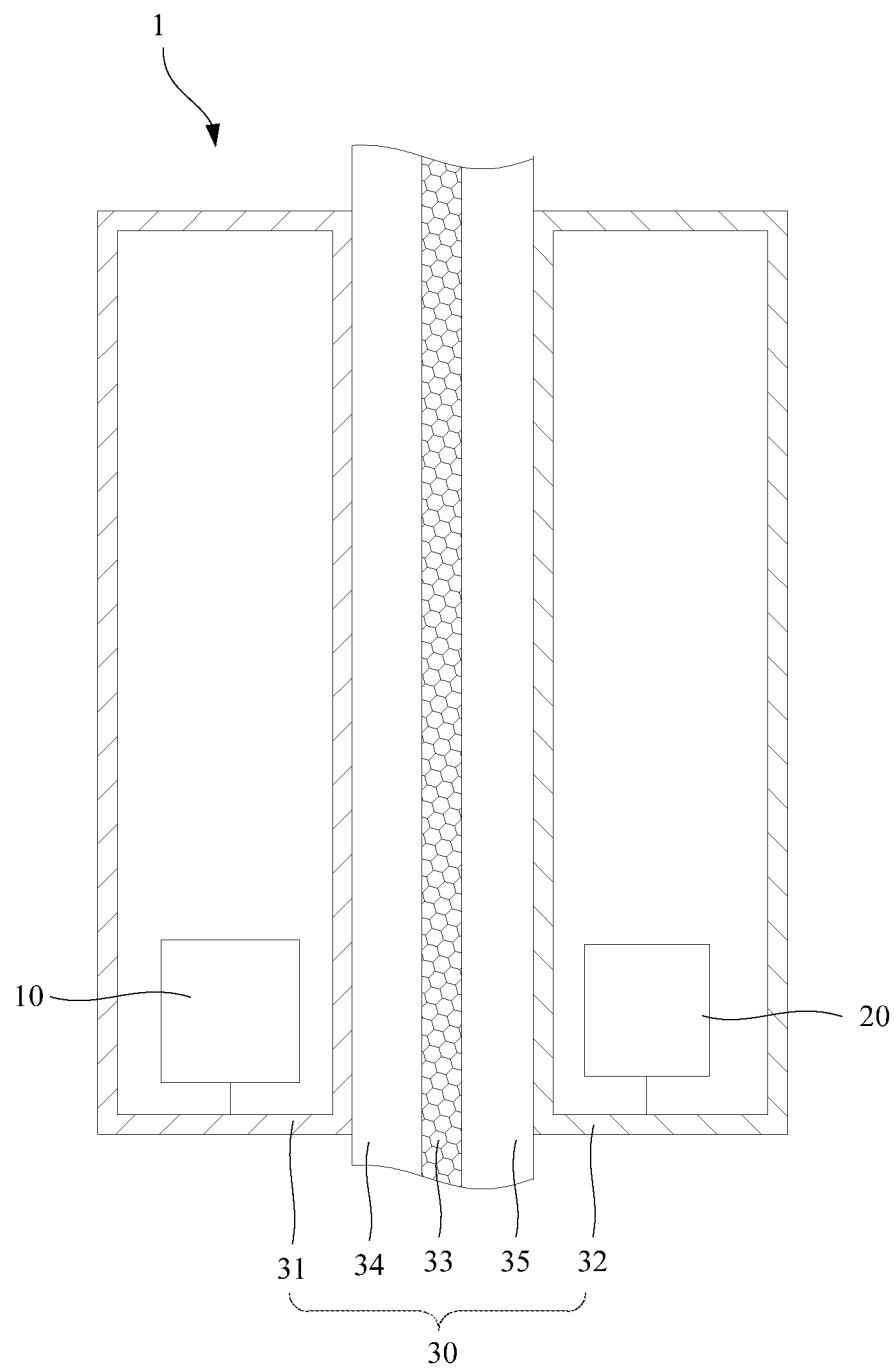
FIG. 1 is a first schematic structural view of a circuit module according to an embodiment of the present disclosure.

FIG. 1 is a first schematic structural view of a circuit module according to an embodiment of the present disclosure.

With reference to FIG. 1, an embodiment of the present disclosure provides a circuit module 1. The circuit module 1 includes: a first circuit unit 10 outputting a first voltage; a second circuit unit 20 outputting a second voltage, where the second voltage is less than the first voltage; and a shielding structure 30 arranged between the first circuit unit 10 and the second circuit unit 20. The shielding structure 30 includes: a first conductor layer 31 electrically coupled to the first circuit unit 10; a second conductor layer 32 electrically coupled to the second circuit unit 20; a third conductor layer 33 located between the first conductor layer 31 and the second conductor layer 32; a first insulation layer 34 arranged between the first conductor layer 31 and the third conductor layer 33; and a second insulation layer 35 arranged between the second conductor layer 32 and the third conductor layer 33.

Specifically, the circuit module 1 is applied to a solid-state transformer system to achieve electric power transmission.

The circuit module 1 includes the shielding structure 30, and the first circuit unit 10 and the second circuit unit 20 arranged at two sides of the shielding structure 30, respectively. The first circuit unit 10 outputs the first voltage, and the second circuit unit 20 outputs the second voltage, where the first voltage is greater than the second voltage. The first circuit unit 10 and the second circuit unit 20 may have a type and a structure well known to those skilled in the art. The solid-state transformer system also includes a transformer. The transformer includes a first winding and a second winding, where the first winding is arranged at one side of the first circuit unit 10 and connected to the first circuit unit 10, and the second winding is arranged at one side of the second circuit unit 20 and connected to the second circuit unit 20.

The shielding structure 30 includes the first insulation layer 34 and the second insulation layer 35, where the first insulation layer 34 and the second insulation layer 35 are stacked. The first insulation layer 34 may be made from any one of nylon, epoxy resin, organic silicone resin, polyurethane, polytetrafluoroethylene, silicone rubber, ceramics, etc.; also, the second insulation layer 35 may be made from any one of nylon, epoxy resin, organic silicone resin, polyurethane, polytetrafluoroethylene, silicone rubber, ceramics, etc. In this way, both the first insulation layer 34 and the second insulation layer 35 may have relatively good insulation performance. The first insulation layer 34 and the second insulation layer 35 may be the same or different in terms of their material.

The thickness of the first insulation layer 34 and the second insulation layer 35 can be defined according to their own material and the voltage withstand level of the circuit module 1, which is not limited in this embodiment.

The shielding structure 30 also includes the first conductor layer 31, the second conductor layer 32, and the third conductor layer 33, where the third conductor layer 33 is arranged between the first insulation layer 34 and the second insulation layer 35, the first conductor layer 31 is arranged at one side of the first insulation layer 34 close to the first circuit unit 10, the second conductor layer 32 is arranged at one side of the second insulation layer 35 close to the second circuit unit 20. In this way, the first conductor layer 31, the first insulation layer 34, the third conductor layer 33, the second insulation layer 35 and the second conductor layer 32 are stacked in sequence, and high temperature press-fitting, electroplating, sputtering, spraying and other methods may be used for molding between any adjacent two of the above.

In some embodiments, the first conductor layer 31 may be a metal layer, a semiconducting layer, or a composite structure of a metal layer and a semiconducting layer; the second conductor layer 32 may be a metal layer, a semiconducting layer, or a composite structure of a metal layer and a semiconducting layer; and the third conductor layer 33 may be a metal layer, a semiconducting layer, or a composite structure of a metal layer and a semiconducting layer.

The metal layer may be copper, silver, nickel, tin or the like. The metal layer is a material that is readily conducting, which can effectively shield the electric fields of the first circuit unit 10 and the second circuit unit 20, and improve the voltage withstand level of the shielding structure 30.

The semiconducting layer may be made from carbon powder, carbon fiber, or a mixture of nickel-silver-copper mixed powder and liquid adhesive, which is beneficial to render uniform surface electric field on the inner surface of the shielding structure 30 and improve the voltage withstand level of the shielding structure 30. The material and ratio of the semiconducting layer may be selected as required.

Figure 2:
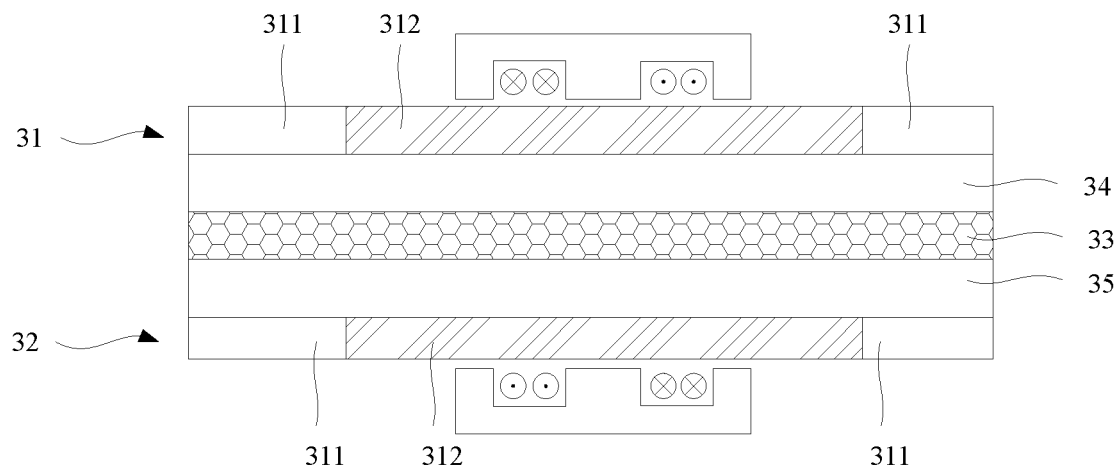
FIG. 2 is a schematic structural view of the shielding structure in FIG. 1.

FIG. 2 is a schematic structural view of the shielding structure in FIG. 1.

With reference to FIG. 2, in some embodiments, when both the first conductor layer 31 and the second conductor layer 32 are of a composite formation of a metal layer 311 and a semiconducting layer 312, the metal layer 311 and the semiconducting layer 312 are located in the same plane. Since the resistivity of the semiconducting layer 312 is greater than the resistivity of the metal layer 311, the semiconducting layer 312 may be located at a position corresponding to the transformer. In this way, when the alternating magnetic field of the transformer passes through the shielding structure 30, the presence of the semiconducting layer 312 is conducive to reducing eddy current losses.

The first conductor layer 31 is electrically coupled to the first circuit unit 10, that is, the first conductor layer 31 and the first circuit unit 10 are equipotential. In this way, the first conductor layer 31 may function to shield the electric field formed by the first circuit unit 10. The first conductor layer 31 is fixed and connected to the first insulation layer 34, so that respective positions at the side of the first insulation layer 34 close to the first conductor layer 31 have the same potential, avoiding discharging between the first conductor layer 31 and the first insulation layer 34.

The second conductor layer 32 is electrically coupled to the second circuit unit 20, that is, the second conductor layer 32 and the second circuit unit 20 are equipotential. In this way, the second conductor layer 32 may function to shield the electric field formed by the second circuit unit 20. The second conductor layer 32 is fixed and connected to the second insulation layer 35, so that respective positions at the side of the second insulation layer 35 close to the second conductor layer 32 have the same potential, avoiding discharge between the second conductor layer 32 and the second insulation layer 35.

In some embodiments, the third conductor layer 33 is arranged between the first insulation layer 34 and the second insulation layer 35, and the third conductor layer 33 is electrically coupled to a reference voltage between a first voltage and a second voltage. In this way, the side of the first insulation layer 34 close to the third conductor layer 33 and the side of the second insulation layer 35 close to the third conductor layer 33 have the same potential, avoiding discharging between the first insulation layer 34 and the third conductor layer 33, and between the second insulation layer 35 and the third conductor layer 33.

Moreover, the first insulation layer 34 and the second insulation layer 35 are connected in series for voltage division. Compared with the one-piece insulation method without the third conductor layer 33, the thickness of the first insulation layer 34 and the second insulation layer 35 is reduced, and the dielectric strength of both of them is increased, whereby a sum of thicknesses of the first insulation layer 34 and the second insulation layer 35 is accordingly smaller than the thickness of the one-piece insulation layer. Exemplarily, under the same voltage withstand level, the shielding structure without arrangement of the third conductor layer 33 may have a thickness of 4.3 mm, while the shielding structure with arrangement of the third conductor layer 33 may have a reduced thickness of 2.7 mm.

Meanwhile, the voltage division by series connection of the first insulation layer 34 and the second insulation layer 35 is conducive to increasing the partial discharge inception voltage (PDIV) of the first insulation layer 34 and the second insulation layer 35, slowing the aging of the first insulation layer 34 and the second insulation layer 35, and increasing the service life of the first insulation layer 34 and the second insulation layer 35.

In some embodiments, according to the theory of dielectric breakdown, the thinner the thickness of the insulating medium, the higher the dielectric strength of the insulating medium. The dielectric strength refers to the maximum voltage that an insulating medium can withstand per unit thickness when the insulating medium is broken down. The greater the dielectric strength of the insulating medium, the better the insulation performance of the insulating medium. Therefore, with arrangement of the first insulation layer 34 and the second insulation layer 35 that have a relatively thin thickness, the shielding structure 30 also has relatively good insulation performance.

Figure 3:
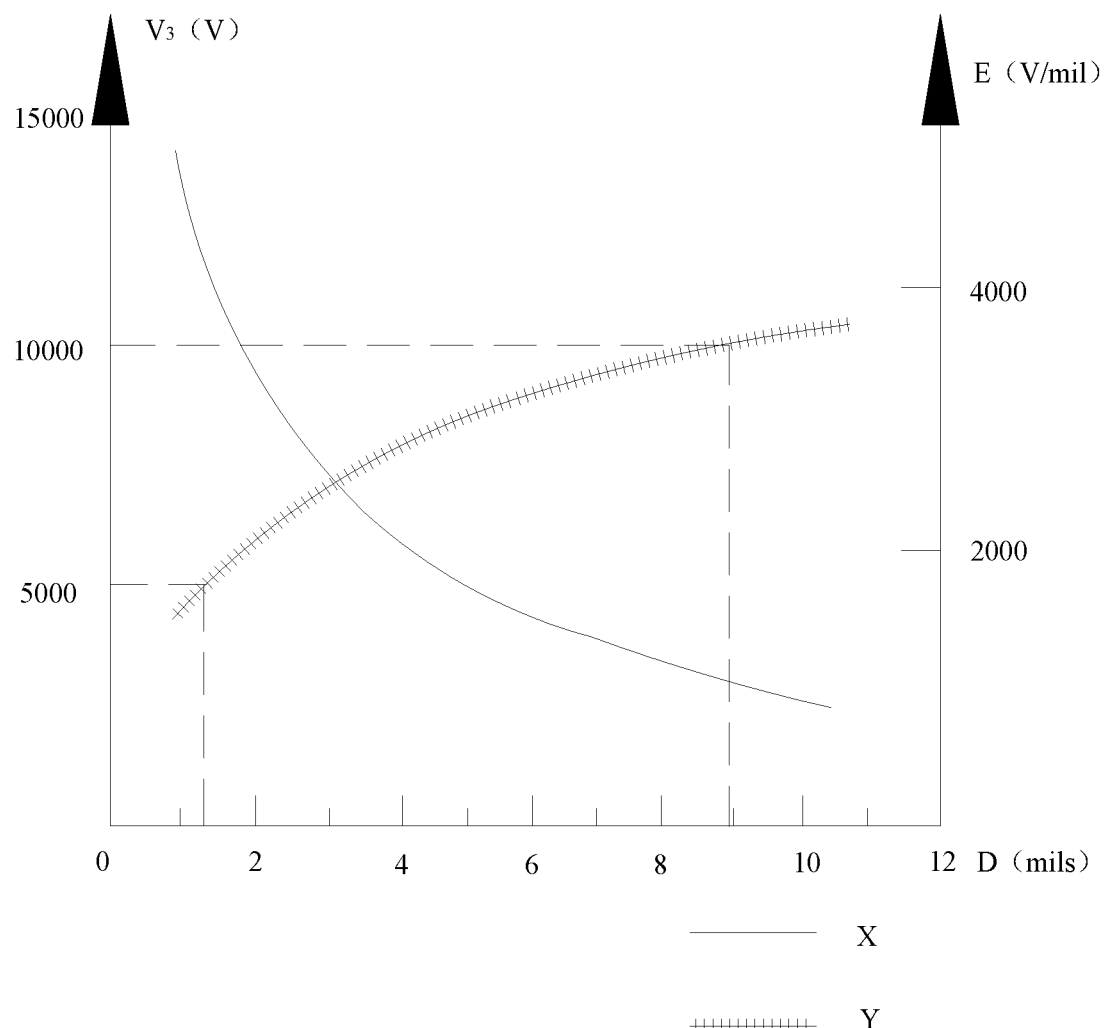
FIG. 3 is a graph illustrating thickness D of an insulating medium and dielectric strength E of the insulating medium, a breakdown voltage $V_3$ of the insulating medium.

FIG. 3 is a graph illustrating thickness D of an insulating medium and dielectric strength E of the insulating medium, a breakdown voltage $V_3$ of the insulating medium.

In some embodiments, with reference to FIG. 3, the dielectric strength E of the insulating medium and the thickness D of the insulating medium have a nonlinear relationship, and the relationship therebetween is shown as a first curve X. The breakdown voltage $V_3$ of the insulating medium and the thickness D of the insulating medium also have a nonlinear relationship, and the relationship therebetween is shown as a second curve Y.

The insulating medium has a first voltage withstand thickness of about 1.2 mils at 5 kV and a second voltage withstand thickness of about 9 mils at 10 kV, while twice the first voltage withstand thickness is far less than the second voltage withstand thickness. In other words, the thinner the thickness D of the insulating medium, the greater the dielectric strength E of the insulating medium, and the better the insulation performance of the insulating medium.

Figure 4:
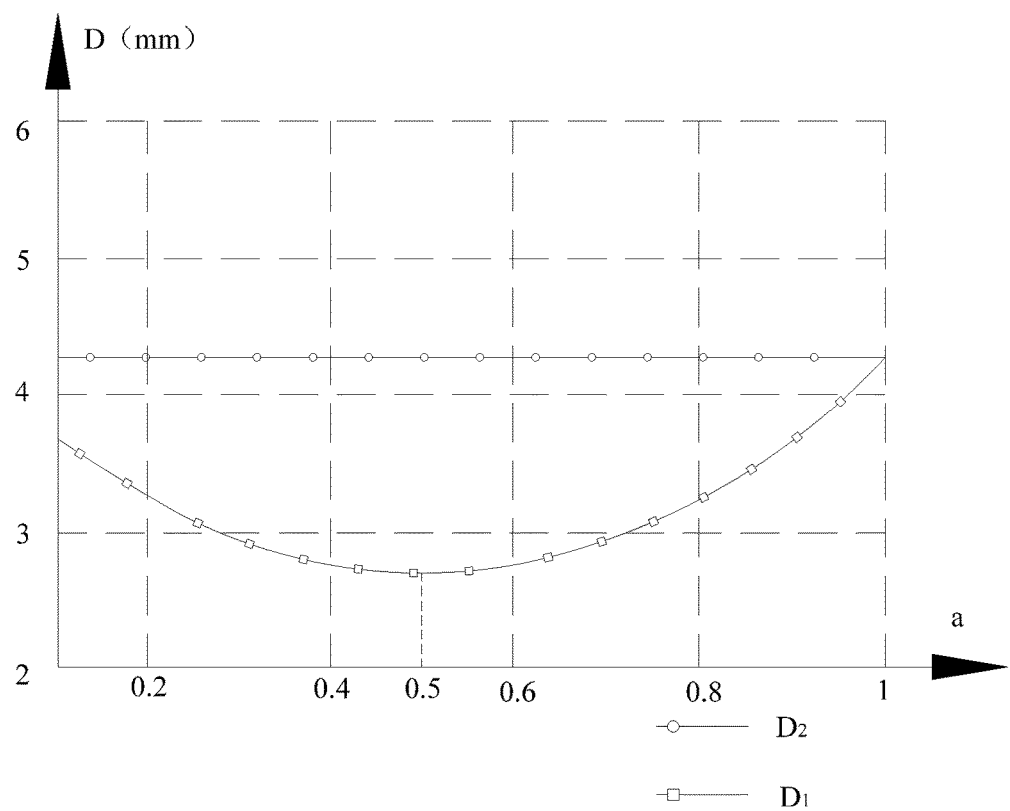
FIG. 4 is a graph illustrating a ratio $\alpha$ of a reference voltage to a circuit unit voltage difference and thickness D of the shielding structure in FIG. 1.

FIG. 4 is a graph illustrating a ratio $\alpha$ of a reference voltage to a circuit unit voltage difference and thickness D of the shielding structure in FIG. 1. In some embodiments, with reference to FIG. 4, the shielding structure 30 with arrangement of the third conductor layer 33 has a stacked thickness $D_1$, and the shielding structure 30 without arrangement of the third conductor layer 33 has a one-piece insulation layer thickness $D_2$. The stacked thickness $D_1$ is smaller than the one-piece insulation layer thickness $D_2$ after the third conductor layer 33 is arranged inside the insulation layer, that is, the overall thickness of the shielding structure 30 is reduced, the assembled circuit module 1 has a relatively compact structure, the weight of the shielding structure 30 accounts for a smaller proportion in the circuit module 1, the circuit module 1 has relatively high power density, meeting design requirements for lightweight.

Further, the magnitude of the stacked thickness $D_1$ is associated with the magnitude of the reference voltage on the third conductor layer 33.

Specifically, there is a voltage difference between the first voltage and the second voltage. For ease of description, the voltage difference is termed as a circuit unit voltage difference $V_1$. With reference to FIG. 4, the abscissa axis in the figure is the ratio $\alpha$ of the reference voltage to the circuit unit voltage difference $V_1$. The ordinate axis is the thickness D of the shielding structure 30. Then, when the reference voltage is greater than the second voltage and less than the first voltage, the stacked thickness $D_1$ is less than the one-piece insulation layer thickness $D_2$, so that the weight of the shielding structure 30 can be reduced and the power density of the circuit module 1 can be increased.

The magnitude of the reference voltage may be selected according to the requirement for the thickness of the shielding structure 30.

According to FIG. 4, when the ratio $\alpha$ of the reference voltage to the voltage difference between the first voltage and the second voltage increases from zero, the stacked thickness $D_1$ of the shielding structure 30 gradually decreases, and then begins to increase.

In some embodiments, when the potential difference between the first conductor layer 31 and the third conductor layer 33 is equal to the potential difference between the third conductor layer 33 and the second conductor layer 32, that is, when the ratio of the reference voltage to the circuit unit voltage difference $V_1$ is 0.5, the shielding structure 30 in this embodiment is reduced to a minimum thickness, and the shielding structure 30 has a minimum weight.

Figure 5:
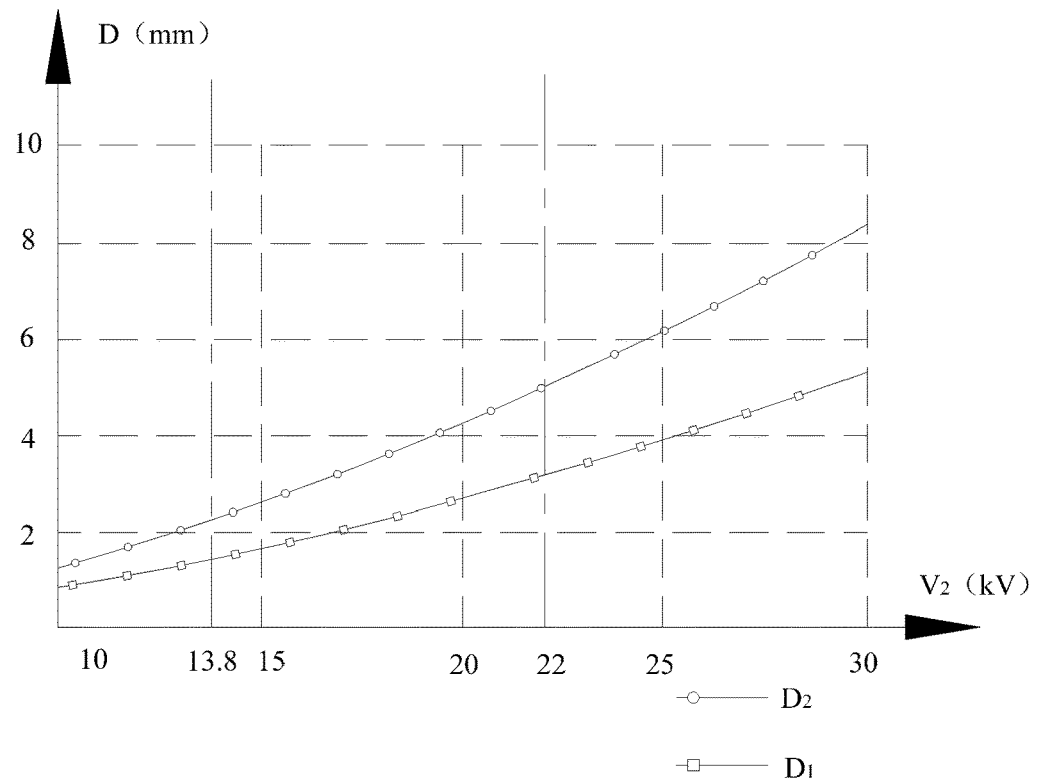
FIG. 5 is a graph illustrating thickness of the shielding structure when the circuit module in FIG. 1 is applied to grids of different voltages.

FIG. 5 is a graph illustrating thickness of the shielding structure when the circuit module in FIG. 1 is applied to grids of different voltages. With reference to FIG. 5, the abscissa is a grid voltage $V_2$ at which the circuit module 1 is, and the ordinate is the thickness D of the shielding structure 30. The shielding structure 30 without arrangement of the third conductor layer 33 has a one-piece insulation layer thickness $D_2$ of about 5 mm at 22 kV. By means of arranging the third conductor layer 33 and enabling a potential difference between the first conductor layer 31 and the third conductor layer 33 to be equal to a potential difference between the third conductor layer 33 and the second conductor layer 32, the stacked thickness $D_1$ of the shielding structure 30 may be reduced to approximately 3.15 mm. Certainly, when the third conductor layer 33 is arranged at other voltage position, the thickness of the shielding structure 30 is also reduced.

In some embodiments, also, there may be multiple third conductor layers 33, and the third conductor layers 33 separate the insulating medium into multiple insulation layers, so as to reduce the thickness of the shielding structure 30.

Figure 6:
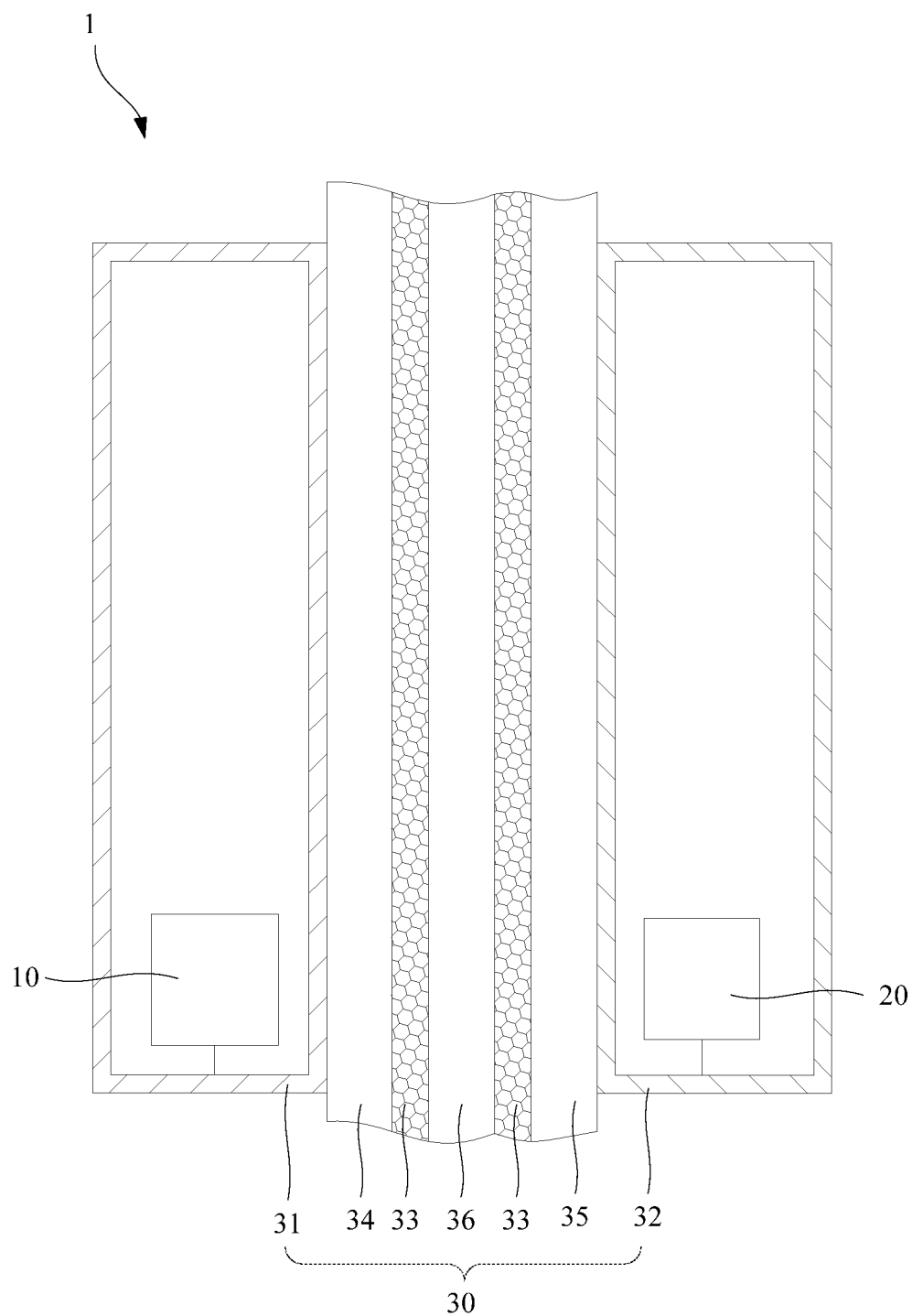
FIG. 6 is a second schematic structural view of a circuit module according to an embodiment of the present disclosure.

FIG. 6 is a second schematic structural view of a circuit module according to an embodiment of the present disclosure. With reference to FIG. 6, an example is taken where the shielding structure 30 includes two third conductor layers 33. The shielding structure 30 further includes: a third insulation layer 36; and two third conductor layers 33 spaced apart, each of which is located between the first insulation layer 34 and the second insulation layer 35, where the third insulation layer 36 is located between the two third conductor layers 33, the two third conductor layers 33 are electrically coupled to a first reference voltage and a second reference voltage, respectively, and the first reference voltage and the second reference voltage are both between the first voltage and the second voltage.

At this time, the first conductor layer 31, the first insulation layer 34, the third conductor layer 33, the third insulation layer 36, the third conductor layer 33, the second insulation layer 35 and the second conductor layer 32 are stacked in sequence.

With arrangement of the two third conductor layers 33, the insulating medium is partitioned into three parts, that is, the first insulation layer 34, the third insulation layer 36 and the second insulation layer 35, where the first insulation layer 34, the third insulation layer 36 and the second insulation layer 35 are connected in series for voltage division.

Compared with the aforementioned arrangement with only one third conductor layer 33, in this embodiment, the first insulation layer 34, the second insulation layer 35 and the third insulation layer 36 each have relatively thin thicknesses; and the shielding structure 30 has higher dielectric strength. In addition, according to the theory of dielectric breakdown, the thickness of the shielding structure 30 in this embodiment is less than the thickness of the insulating medium without arrangement of the third conductor layer 33, so as to achieve reduced weight of the shielding structure 30.

The first reference voltage and the second reference voltage may also be selected as required in terms of their magnitude. In some embodiments, the first insulation layer 34, the second insulation layer 35 and the third insulation layer 36 may also equally withstand the circuit unit voltage difference $V_1$, that is, an absolute value of a potential difference between two sides of the first insulation layer 34, an absolute value of a potential difference between two sides of the second insulation layer 35, and an absolute value of a potential difference between two sides of the third insulation layer 36 are equal, so that the shielding structure 30 may have a minimum thickness in this embodiment.

In some embodiments, the first conductor layer 31 is configured to cover the first circuit unit 10, that is, the first conductor layer 31 encloses a cavity for accommodating the first circuit unit 10, and the first conductor layer 31 may function to shield the electric field formed by the first circuit unit 10. The second conductor layer 32 is configured to cover the second circuit unit 20, that is, the second conductor layer 32 encloses a cavity for accommodating the second circuit unit 20, and the second conductor layer 32 may function to shield the electric field formed by the second circuit unit 20.

Figure 7:
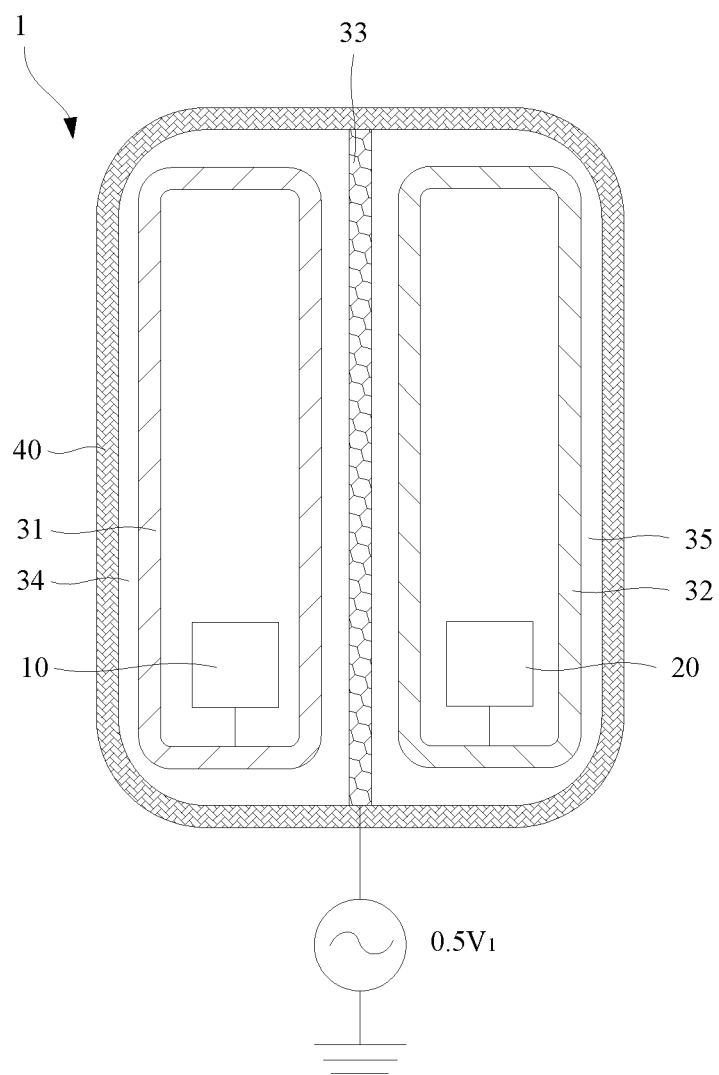
FIG. 7 is a third schematic structural view of a circuit module according to an embodiment of the present disclosure.

In some embodiments, as shown in FIG. 7, the circuit module 1 further includes a shell 40 configured to cover the circuit module 1, where the first insulation layer 34 is configured to cover the first conductor layer 31; the second insulation layer 35 is configured to cover the second conductor layer 32; and the first circuit unit 10 is disposed in parallel with the second circuit unit 20.

That is, the first insulation layer 34 is attached to the outer wall surface of the first conductor layer 31; and the first circuit unit 10, the first conductor layer 31 and the first winding are each located in the cavity enclosed by the first insulation layer 34. The second insulation layer 35 is attached to the outer wall surface of the second conductor layer 32; the second insulation layer 35 also encloses a closed cavity; and the second circuit unit 20, the second conductor layer 32 and the second winding are each located in the cavity enclosed by the second insulation layer 35.

The first circuit unit 10 and the second circuit unit 20 may also be nested with each other. Exemplarily, the first circuit unit 10 is disposed at the periphery of the second circuit unit 20, or the second circuit unit 20 is disposed at the periphery of the first circuit unit 10; and the second insulation layer 35 is arranged between the first circuit unit 10 and the second circuit unit 20 (not shown).

In some implementations, illustration is made in this embodiment by taking an example where the first circuit unit 10 is disposed in parallel with the second circuit unit 20. The shell 40 is disposed at the periphery of the first insulation layer 34 and the second insulation layer 35, and forms a protection for the circuit module 1. The shell 40 may be a structure well known to those skilled in the art, such as a sheet metal casing, with relatively high strength.

At this time, depending on the different structures of the circuit module 1, the shell 40 and the third conductor layer 33 may have the same or different voltages therebetween.

In some embodiments, when the shell 40 is electrically coupled to the third conductor layer 33, the shell 40 and the third conductor layer 33 have the same voltage.

At this time, the circuit module 1 may have a different assembly structure. Exemplarily, FIG. 7 is a third schematic structural view of a circuit module according to an embodiment of the present disclosure. With reference to FIG. 7, the shell 40 may be a container-like structure; and the shell 40 of the circuit module 1 is divided into two accommodating portions by a partition portion, which are used for accommodating the first circuit unit 10 and the second circuit unit 20, respectively, where the partition portion may be formed by the third conductor layer 33.

By means of arranging the third conductor layer 33 as the partition portion, the voltage difference between the shell 40 and the first conductor layer 31, the voltage difference between the shell 40 and the second conductor layer 32, the voltage difference between the first conductor layer 31 and the third conductor layer 33, and the voltage difference between the second conductor layer 32 and the third conductor layer 33 are each reduced, so that the insulation layers within the accommodating portions and at both sides of the partition portion may be reduced in thickness, exemplarily, the thickness of the insulation layers within the accommodating portions at on both sides of the partition portion may be reduced from 2 d for the original one-piece insulation layer to 0.63 d, and the thickness of the insulation layer between the first conductor layer 31 and the second conductor layer 32 may be reduced from 2 d for the original one-piece insulation layer to 1.26 d.

In this way, without a decrease in the voltage withstand level of the shielding structure 30, the thickness and weight of the shielding structure 30 can be reduced, and the weight proportion of the shielding structure 30 in the circuit module 1 can be reduced, improving power density of the circuit module 1.

Figure 8:
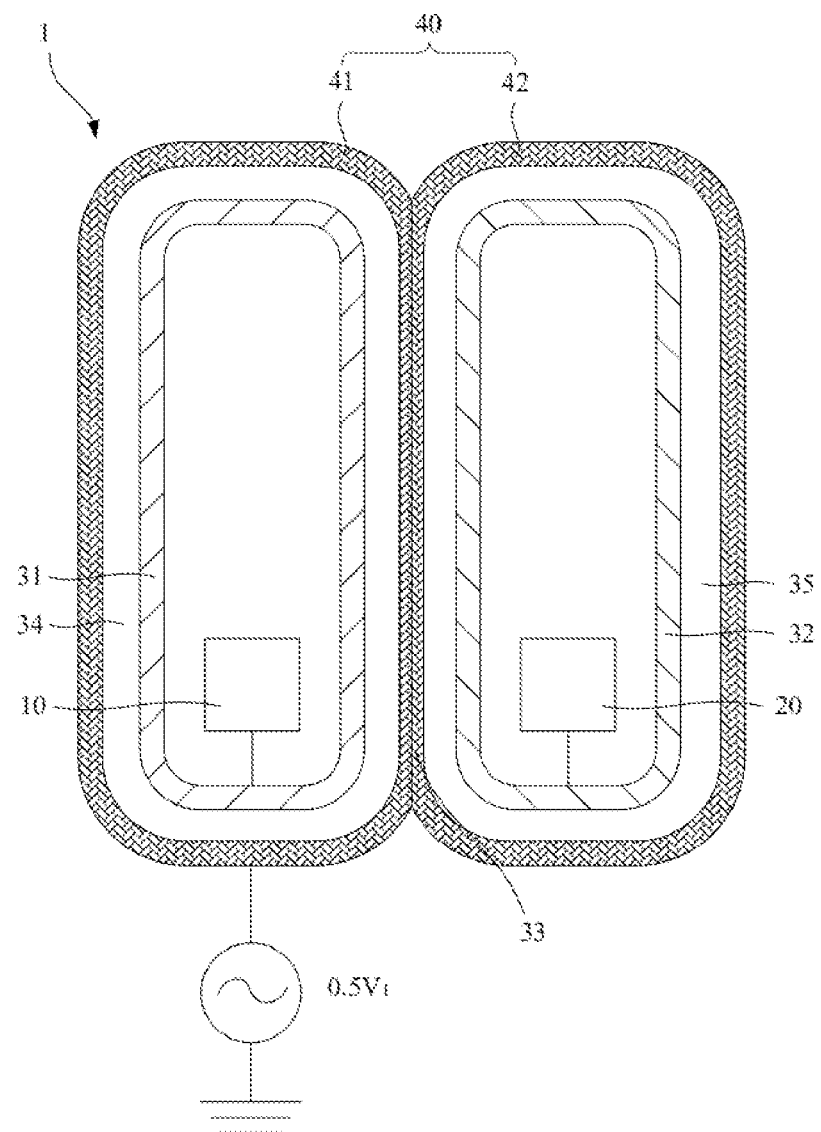
FIG. 8 is a fourth schematic structural view of a circuit module according to an embodiment of the present disclosure.

FIG. 8 is a fourth schematic structural view of a circuit module according to an embodiment of the present disclosure. With reference to FIG. 8, in some embodiments, the shell 40 includes a first shell 41 and a second shell 42, where the first shell 41 is configured to cover the first circuit unit 10, the first conductor layer 31, and the first insulation layer 34; the second shell 42 is configured to cover the second circuit unit 20, the second conductor layer 32, and the second insulation layer 35; and the first shell 41 and the second shell 42 have therebetween a common interface layer for forming the third conductor layer 33.

That is, the first shell 41 and the second shell 42 are two independent components, where the first circuit unit 10, the first insulation layer 34 and the first conductor layer 31 are located in the first shell 41, and the second circuit unit 20, the second insulation layer 35 and the second conductor layer 32 are located in the second shell 42.

Thus, separately, the first shell 41 may be assembled with the first circuit unit 10, the first insulation layer 34 and the first conductor layer 31, and the second shell 42 may also be assembled with the second circuit unit 20, the second insulation layer 35 and the second conductor layers 32, and then the two parts are connected to form the circuit module 1, that is, a modular design can be formed and it is easy to assemble.

The first shell 41 and the second shell 42 have therebetween a common interface layer, and the common interface layer may constitute the third conductor layer 33. The third conductor layer 33 has a reference voltage between the second voltage and the first voltage. In this way, a voltage difference between the shell 40 and the first conductor layer 31 and a voltage difference between the shell 40 and the second conductor layer 32 are each relatively small, and the thickness of the first insulation layer 34 and the thickness of the second insulation layer 35 can be reduced accordingly, that is, the weight of the shielding structure 30 is reduced, and the weight proportion of the shielding structure 30 in the circuit module 1 is reduced, conforming to design requirements of lightweight for the circuit module 1.

Moreover, since the thickness of each of the first insulation layer 34 and the second insulation layer 35 is reduced, the dielectric strength of each of the first insulation layer 34 and the second insulation layer 35 is increased, the voltage withstand levels of the first insulation layer 34 and the second insulation layer 35 are also raised, and thus the shielding structure 30 has a relatively good insulation characteristic.

The first shell 41 and the second shell 42 may be closely fitted (refer to FIG. 8), or may be fastened and connected at some positions by welding or a metal part, which is not limited in this embodiment.

Figure 9:
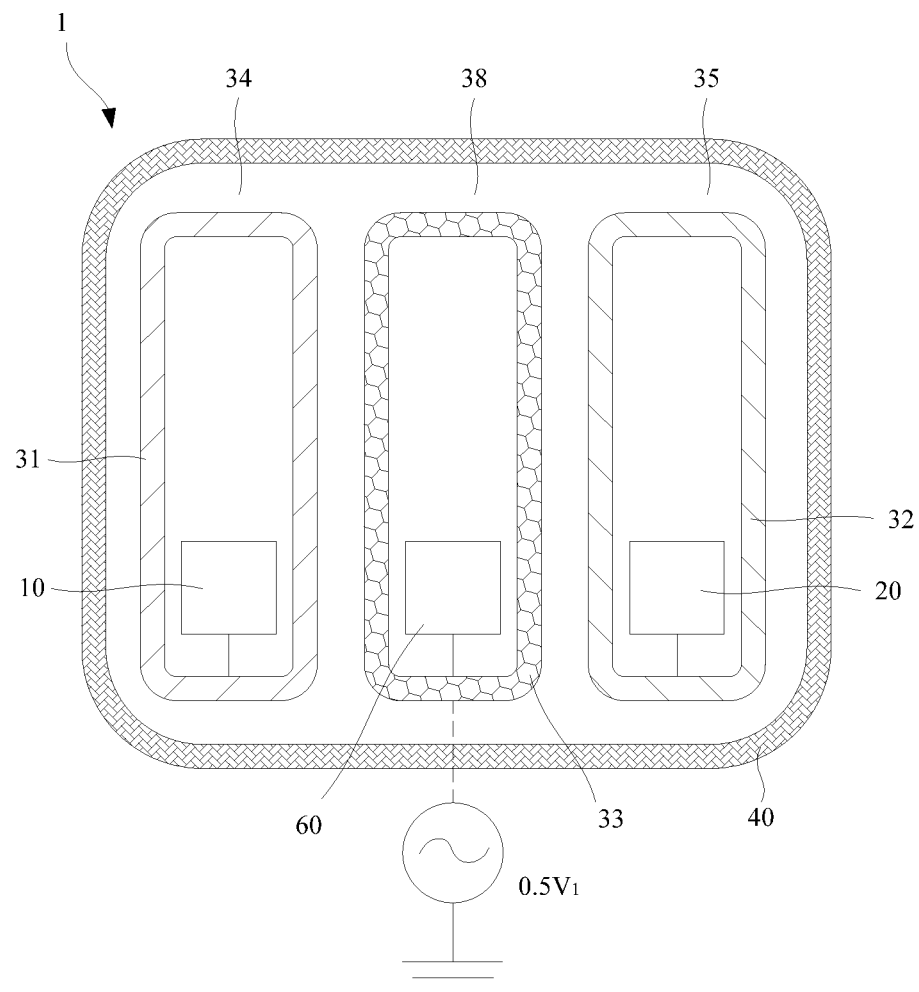
FIG. 9 is a fifth schematic structural view of a circuit module according to an embodiment of the present disclosure.

In some embodiments, the third conductor layer 33 may not be limited to a planar structure. Exemplarily, FIG. 9 is a fifth schematic structural view of a circuit module according to an embodiment of the present disclosure. With reference to FIG. 9, the third conductor layer 33 may extend into a container-like structure for accommodating some electrical components of the circuit module 1.

Specifically, the circuit module 1 further includes: a third circuit unit 60, located between the first circuit unit 10 and the second circuit unit 20, and outputting a third voltage between the first voltage and the second voltage, where the third conductor layer 33 is configured to cover the third circuit unit 60, a second insulating medium 38 is arranged between the shell 40 and the first conductor layer 31, between the shell 40 and the second conductor layer 32, and between the shell 40 and the third conductor layer 33, and the second insulating medium 38 is integrally formed with the first insulation layer 34 and the second insulation layer 35.

That is, the first circuit unit 10 may be construed as a high voltage circuit unit, the second circuit unit 20 may be construed as a low voltage circuit unit, and the third circuit unit 60 may be construed as a medium voltage circuit unit. In this way, some electrical components of the circuit module 1 can also be accommodated in the space enclosed by the third conductor layer 33, and the circuit module 1 has a relatively large storage space so as to realize multiple outputs of the circuit module 1.

The second insulating medium 38 is integrally formed with the first insulation layer 34 and the second insulation layer 35, that is, they may be an integrally molded part. For ease of description, the integrally molded part may be termed as an insulation part, and three accommodating cavities are formed in the insulation part, where the three accommodating cavities are used for accommodating the first circuit unit 10, the second circuit unit 20, and the third circuit unit 60, respectively. In addition, the first conductor layer 31, the second conductor layer 32, and the third conductor layer 33 are attached to inner wall surfaces of the three accommodating cavities, respectively.

The third conductor layer 33 and the shell 40 are electrically coupled to a reference voltage, and the reference voltage is between the first voltage and the second voltage. Thus, a voltage difference between the first conductor layer 31 and the shell 40, a voltage difference between the second conductor layer 32 and the shell 40, a voltage difference between the first conductor layer 31 and the third conductor layer 33, and a voltage difference between the second conductor layer 32 and the third conductor layer 33 are each relatively small. In this way, the portion of the insulation part between the shell 40 and the first conductor layer 31 has a relatively thin thickness, the portion of the insulation part between the shell 40 and the second conductor layer 32 has a relatively thin thickness, the portion of the insulation part between the first conductor layer 31 and the third conductor layer 33 has a relatively thin thickness, and the portion of the insulation part between the second conductor layer 32 and the third conductor layer 33 has a relatively thin thickness. In other words, the shielding structure 30 of the circuit module 1 in this embodiment has a relatively small size and a relatively light weight, so that the weight proportion of the shielding structure 30 in the circuit module 1 is decreased, conforming to design requirements of lightweight for the circuit module 1.

The portion of the insulation part between the first conductor layer 31 and the third conductor layer 33 and the portion of the insulation part between the second conductor layer 32 and the third conductor layer 33 are insulating air gaps of the circuit module 1. Since the portion of the insulation part between the first conductor layer 31 and the third conductor layer 33 is relatively small, and the portion of the insulation part between the second conductor layer 32 and the third conductor layer 33 is also relatively small, alternating current loss (AC loss) of transformer windings is reduced.

In some embodiments, when the shell 40 and the third conductor layer 33 have the same reference voltage, the thickness of the shielding structure 30 is reduced. In this way, when the reference voltage has different voltage values, the circuit module 1 can be applied to different grids.

Figure 10:
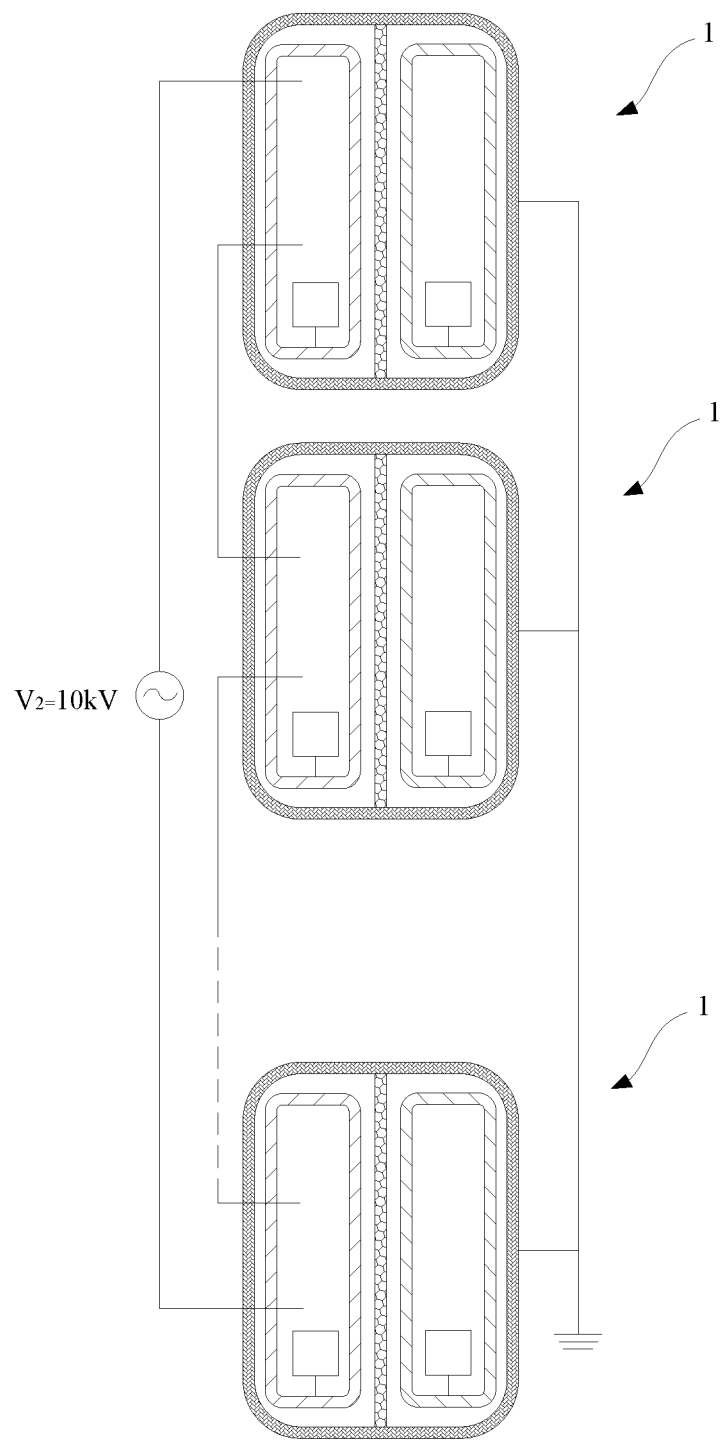
FIG. 10 is a schematic structural view illustrating the circuit module in FIG. 7 when it is applied to a 10 kV grid.

FIG. 10 is a schematic structural view illustrating the circuit module in FIG. 7 when it is applied to a 10 kV grid. With reference to FIG. 10, when the grid voltage $V_2$ applied by the circuit module 1 is 10 kV, multiple circuit modules 1 are disposed in parallel, and third conductor layers 33 of the multiple circuit modules 1 can be grounded.

Figure 11:
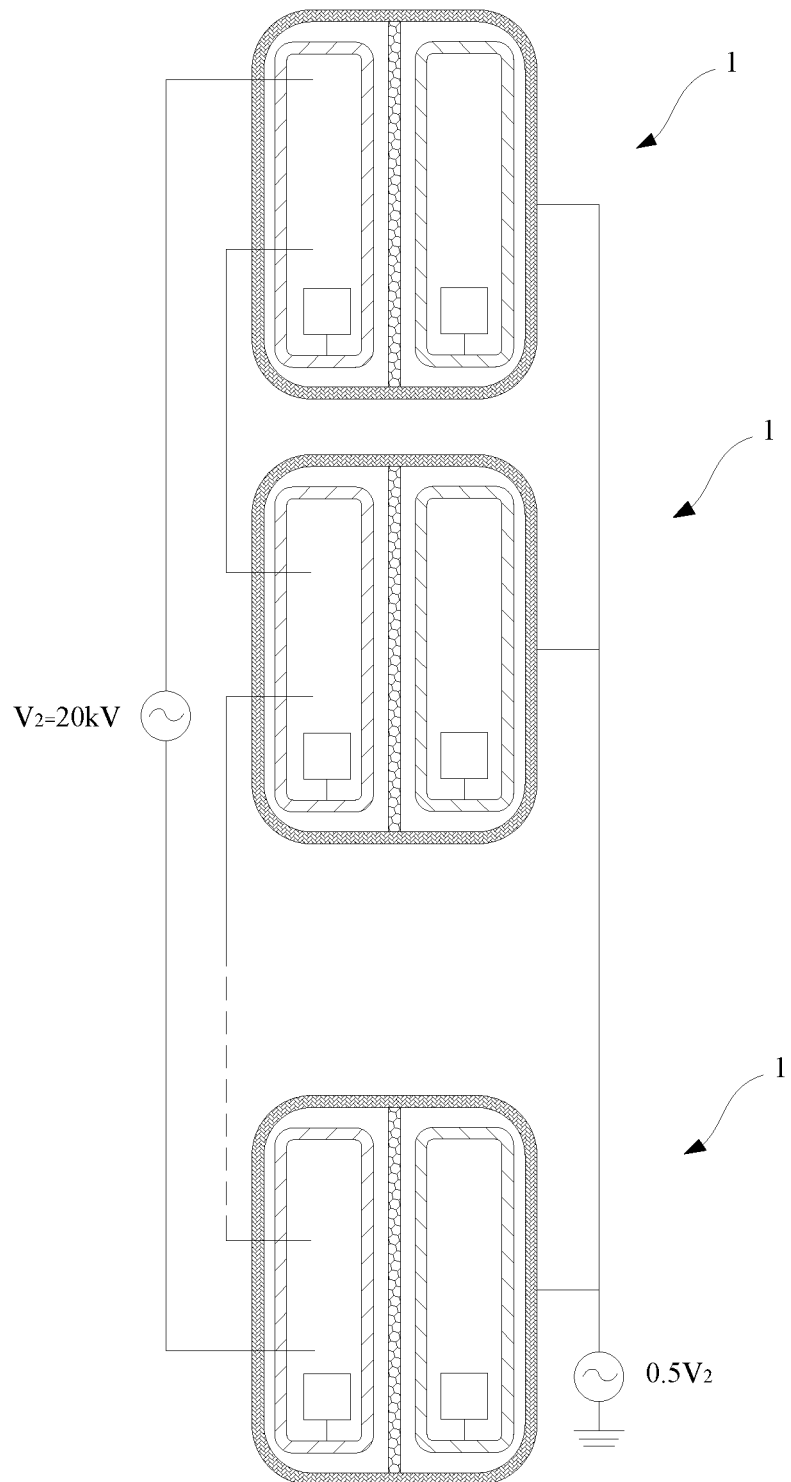
FIG. 11 is a schematic structural view illustrating the circuit module in FIG. 7 when it is applied to a 20 kV grid.

FIG. 11 is a schematic structural view illustrating the circuit module in FIG. 7 when it is applied to a 20 kV grid. With reference to FIG. 11, when the grid voltage $V_2$ applied by the circuit module 1 is 20 kV, multiple circuit modules 1 are disposed in parallel, and each of reference voltages of the multiple circuit modules 1 is half of the voltage difference between the first voltage and the second voltage.

In this way, without changing the structure of the circuit module 1, the circuit module 1 can be applied to different grids and to different positions in a grid. The applicability is wide and the modular design of the circuit module 1 can be easily achieved. Understandably, the thickness of the shielding structure 30 and the reference voltage to which the shell 40 and the third conductor layer 33 are coupled can be set as required, which is not limited in this embodiment.

In some embodiments, the third conductor layer 33 and the shell 40 may have different voltages therebetween.

Figure 12:
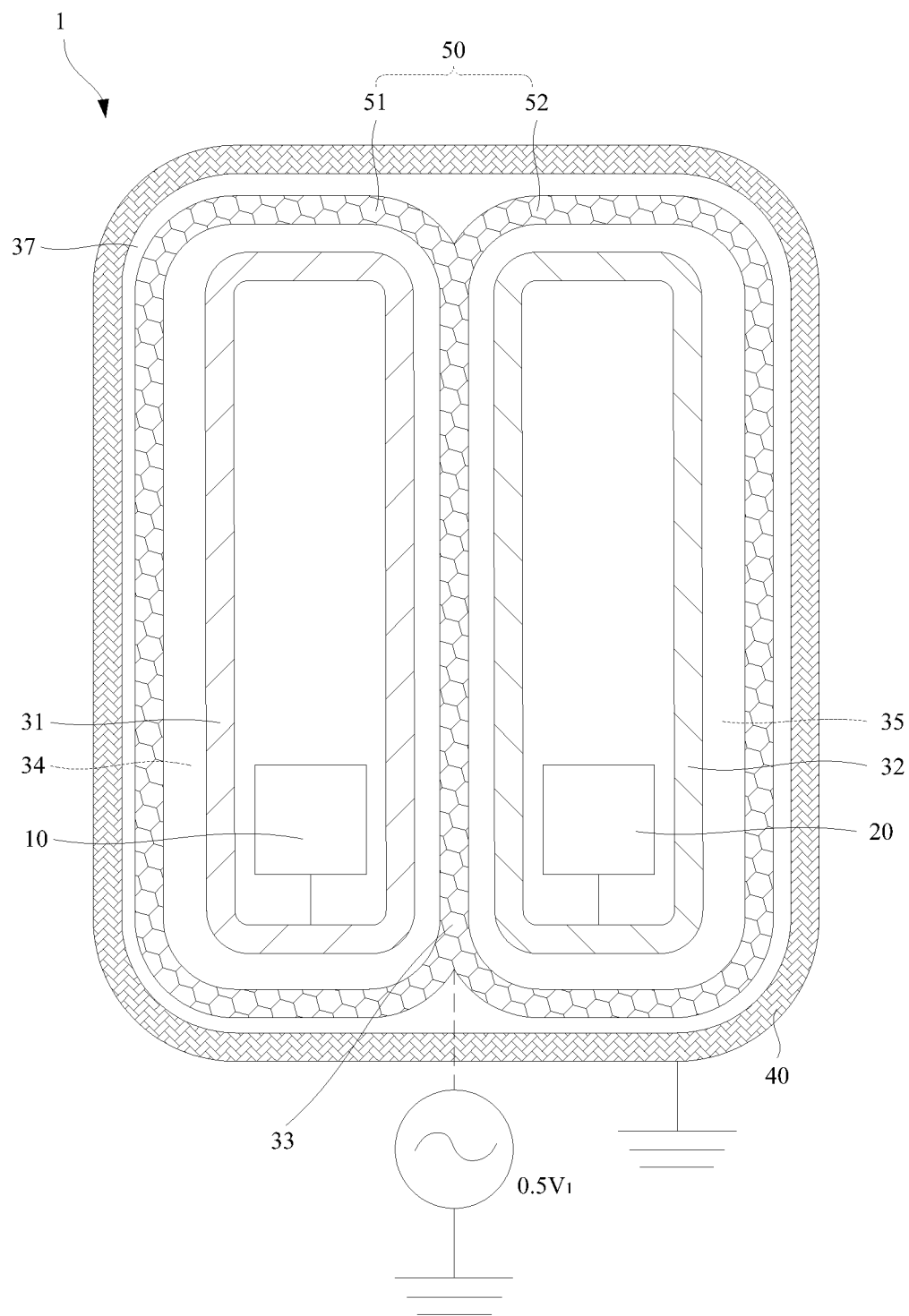
FIG. 12 is a sixth schematic structural view of a circuit module according to an embodiment of the present disclosure.

FIG. 12 is a sixth schematic structural view of a circuit module according to an embodiment of the present disclosure. With reference to FIG. 12, the circuit module 1 further includes a shielding layer 50, a first insulating medium 37 is arranged between the shielding layer 50 and the shell 40, and the shielding layer 50 includes a first shielding layer 51 and a second shielding layer 52, where the first shielding layer 51 is configured to cover the first circuit unit 10, the first conductor layer 31, and the first insulation layer 34; the second shielding layer 52 is configured to cover the second circuit unit 20, the second conductor layer 32, and the second insulation layer 35; the first shielding layer 51 and the second shielding layer 52 have therebetween a common interface layer for forming the third conductor layer 33; and the shell 40 is grounded.

At this time, the shell 40 is grounded so that an electric shock accident is avoided when a human body is in contact with the shell 40, and thus the safety is high.

The voltage of the third conductor layer 33 may be set such that it is between the second voltage and the first voltage. Exemplarily, the voltage of the third conductor layer 33 may be half of the difference between the first voltage and the second voltage. In this way, the voltage difference between two sides of the first insulating medium 37 is equal to the voltage of the third conductor layer 33, the voltage difference between two sides of the first insulation layer 34 is equal to the difference between the first voltage and the reference voltage, and the voltage difference between two sides of the second insulation layer 35 is equal to the difference between the second voltage and the reference voltage.

Compared with the case when the first shielding layer 51 and the second shielding layer 52 are not arranged, the voltage difference between two sides of the first insulation layer 34, the voltage difference between two sides of the second insulation layer 35, and the voltage difference between two sides of the first insulating medium 37 are each reduced. Therefore, the thickness of the first insulation layer 34, the second insulation layer 35 and the first insulating medium 37 can each be reduced. According to the breakdown theory of the first insulating medium 37, the dielectric strength of the first insulation layer 34, the second insulation layer 35 and the first insulating medium 37 is raised, and the shielding structure 30 has relatively good insulation performance.

Moreover, since the first insulation layer 34, the second insulation layer 35, and the first insulating medium 37 can each be reduced in thickness, and their stacked thickness is also reduced compared to the thickness of the one-piece insulation layer when the first shielding layer 51 and the second shielding layer 52 are not arranged, the weight of the shielding structure 30 is reduced, so that the weight proportion of the shielding structure 30 in the circuit module 1 is reduced, conforming to design requirements of lightweight for the circuit module 1.

The first shielding layer 51 may be a metal layer, a semiconducting layer, or a composite structure of a metal layer and a semiconducting layer; and the second shielding layer 52 may also be a metal layer, a semiconducting layer, or a composite structure of a metal layer and a semiconducting layer, both of which are not limited in this embodiment.

The first shielding layer 51 and the second shielding layer 52 may be integrally formed (as shown in FIG. 12), or the first shielding layer 51 and the second shielding layer 52 may be independent of each other and have a relatively large fitting surface. The first shielding layer 51 and the second shielding layer 52 may also be connected at some positions by welding, as long as the connection therebetween can be achieved.

An embodiment of the present disclosure provides a solid-state transformer system (not shown), which includes multiple circuit modules 1 as described above. The circuit module 1 has been described in the aforementioned embodiments with regard to its structure, function, operating principle, and beneficial effects, which will not be described again in this embodiment.

The solid-state transformer system adopts the aforementioned circuit module 1, and the shielding structure 30 of the circuit module 1 has relatively good insulation performance, moreover, the weight of the shielding structure 30 in the circuit module 1 may be reduced so that the weight proportion of the shielding structure 30 in the circuit module 1 is reduced, increasing the power density of the circuit module 1, and meeting design requirements of lightweight for the solid-state transformer system.

In addition, with the modular and lightweight design of the shell 40 and the shielding structure 30 in the present disclosure, a manner in which the shell 40 in the circuit module 1 is assembled with respective circuit units can be flexibly adjusted, whereby a flexible assembly of the solid-state transformer system can be achieved so as to handle capacity expansion or voltage boosting requirements; by means of adjusting the potential of the reference voltage to which the shell 40 and the third conductor layer 33 are coupled and adapting the corresponding thickness of the solid insulation layer, the solid-state transformer system according to the present disclosure is compatible with different levels of medium voltage grid, thereby improving product competitiveness.

Various embodiments or implementations are described in the present specification progressively, and each embodiment focuses on differences from other embodiments. For the same or similar part between the embodiments, reference may be made to each other.

In the description of the present specification, the description with reference to the terms such as "an embodiment", "some embodiments", "an illustrative embodiment", "an example" "a specific example", or "some examples" means that specific features, structures, materials, or characteristics described in connection with the embodiment or the example are included in at least one embodiment or example of the present disclosure. In the specification, schematic representations for the above terms are not necessarily directed to the same embodiment or example. Furthermore, the described specific features, structures, materials, or characteristics may be combined properly in any one or more embodiments or examples.

Finally, it should be noted that the foregoing embodiments are merely intended for describing, rather than limiting, the technical solutions of the present disclosure. Although the present disclosure has been described in detail with reference to the foregoing embodiments, persons of ordinary skill in the art should understand that they may still make modifications to the technical solutions described in the foregoing embodiments, or make equivalent replacements to some or all technical features therein; however, these modifications or replacements do not make the essence of corresponding technical solutions depart from the scope of the technical solutions in the embodiments of the present disclosure.

What is claimed is:

1. A circuit module, comprising:
   a first circuit unit outputting a first voltage;
   a second circuit unit outputting a second voltage, wherein the second voltage is less than the first voltage; and
   a shielding structure arranged between the first circuit unit and the second circuit unit, wherein the shielding structure comprises:
      a first conductor layer electrically coupled to the first circuit unit;
      a second conductor layer electrically coupled to the second circuit unit;
      a third conductor layer located between the first conductor layer and the second conductor layer;
      a first insulation layer arranged between the first conductor layer and the third conductor layer; and
      a second insulation layer arranged between the second conductor layer and the third conductor layer.

2. The circuit module according to claim 1, wherein the third conductor layer is electrically coupled to a reference voltage between the first voltage and the second voltage.

3. The circuit module according to claim 2, wherein a potential difference between the first conductor layer and the third conductor layer is equal to a potential difference between the third conductor layer and the second conductor layer.

4. The circuit module according to claim 1, wherein the shielding structure further comprises:
   a third insulation layer; and
   two third conductor layers spaced apart, each of which is located between the first insulation layer and the second insulation layer,
   wherein the third insulation layer is located between the two third conductor layers, the two third conductor layers are electrically coupled to a first reference voltage and a second reference voltage, respectively, and the first reference voltage and the second reference voltage are both between the first voltage and the second voltage.

5. The circuit module according to claim 4, wherein an absolute value of a potential difference between two sides of the first insulation layer, an absolute value of a potential difference between two sides of the second insulation layer, and an absolute value of a potential difference between two sides of the third insulation layer are equal.

6. The circuit module according to claim 1, wherein the first conductor layer is configured to cover the first circuit unit, and the second conductor layer is configured to cover the second circuit unit.

7. The circuit module according to claim 6, further comprising:
   a shell configured to cover the circuit module,
   wherein the first insulation layer is configured to cover the first conductor layer, the second insulation layer is configured to cover the second conductor layer, and the first circuit unit is disposed in parallel with the second circuit unit.

8. The circuit module according to claim 7, wherein the shell is electrically coupled to the third conductor layer.

9. The circuit module according to claim 8, wherein the shell comprises a first shell and a second shell, wherein
   the first shell is configured to cover the first circuit unit, the first conductor layer, and the first insulation layer;
   the second shell is configured to cover the second circuit unit, the second conductor layer, and the second insulation layer; and
   the first shell and the second shell have therebetween a common interface layer for forming the third conductor layer.

10. The circuit module according to claim 7, further comprising: a shielding layer, wherein a first insulating medium is arranged between the shielding layer and the shell, and the shielding layer comprises a first shielding layer and a second shielding layer, wherein
   the first shielding layer is configured to cover the first circuit unit, the first conductor layer, and the first insulation layer;
   the second shielding layer is configured to cover the second circuit unit, the second conductor layer, and the second insulation layer;
   the first shielding layer and the second shielding layer have therebetween a common interface layer for forming the third conductor layer; and
   the shell is grounded.

11. The circuit module according to claim 8, further comprising: a third circuit unit, located between the first circuit unit and the second circuit unit, and outputting a third voltage between the first voltage and the second voltage, wherein
   the third conductor layer is configured to cover the third circuit unit, a second insulating medium is arranged between the shell and the first conductor layer, between the shell and the second conductor layer, and between the shell and the third conductor layer, and the second insulating medium is integrally formed with the first insulation layer and the second insulation layer.

12. A solid-state transformer system, comprising: multiple circuit modules, wherein each circuit module of the multiple circuit modules comprises:
- a first circuit unit outputting a first voltage;
- a second circuit unit outputting a second voltage, wherein the second voltage is less than the first voltage; and
- a shielding structure arranged between the first circuit unit and the second circuit unit, wherein the shielding structure comprises:
  - a first conductor layer electrically coupled to the first circuit unit;
  - a second conductor layer electrically coupled to the second circuit unit;
  - a third conductor layer located between the first conductor layer and the second conductor layer;
  - a first insulation layer arranged between the first conductor layer and the third conductor layer; and
  - a second insulation layer arranged between the second conductor layer and the third conductor layer.

13. The solid-state transformer system according to claim 12, wherein the third conductor layer is electrically coupled to a reference voltage between the first voltage and the second voltage.

14. The solid-state transformer system according to claim 13, wherein a potential difference between the first conductor layer and the third conductor layer is equal to a potential difference between the third conductor layer and the second conductor layer.

15. The solid-state transformer system according to claim 12, wherein the shielding structure further comprises:
- a third insulation layer; and
- two third conductor layers spaced apart, each of which is located between the first insulation layer and the second insulation layer,
- wherein the third insulation layer is located between the two third conductor layers, the two third conductor layers are electrically coupled to a first reference voltage and a second reference voltage, respectively, and the first reference voltage and the second reference voltage are both between the first voltage and the second voltage.

16. The solid-state transformer system according to claim 15, wherein an absolute value of a potential difference between two sides of the first insulation layer, an absolute value of a potential difference between two sides of the second insulation layer, and an absolute value of a potential difference between two sides of the third insulation layer are equal.

17. The solid-state transformer system according to claim 12, wherein the first conductor layer is configured to cover the first circuit unit, and the second conductor layer is configured to cover the second circuit unit.

18. The solid-state transformer system according to claim 17, wherein the circuit module further comprises:
- a shell configured to cover the circuit module,
- wherein the first insulation layer is configured to cover the first conductor layer, the second insulation layer is configured to cover the second conductor layer, and the first circuit unit is disposed in parallel with the second circuit unit.

19. The solid-state transformer system according to claim 18, wherein the shell is electrically coupled to the third conductor layer.

20. The solid-state transformer system according to claim 18, wherein the circuit module further comprises:
- a shielding layer, wherein a first insulating medium is arranged between the shielding layer and the shell, and the shielding layer comprises a first shielding layer and a second shielding layer, wherein
- the first shielding layer is configured to cover the first circuit unit, the first conductor layer, and the first insulation layer;
- the second shielding layer is configured to cover the second circuit unit, the second conductor layer, and the second insulation layer;
- the first shielding layer and the second shielding layer have therebetween a common interface layer for forming the third conductor layer; and
- the shell is grounded.

* * * * *